US006459314B2

(12) United States Patent
Kim

(10) Patent No.: US 6,459,314 B2
(45) Date of Patent: Oct. 1, 2002

(54) DELAY LOCKED LOOP CIRCUIT HAVING DUTY CYCLE CORRECTION FUNCTION AND DELAY LOCKING METHOD

(75) Inventor: Kyu-hyoun Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/850,019

(22) Filed: May 7, 2001

(30) Foreign Application Priority Data

Jun. 7, 2000 (KR) .............................. 00-31030

(51) Int. Cl.[7] .................................................. H03L 7/00
(52) U.S. Cl. ........................................ 327/161; 327/158
(58) Field of Search ................................. 327/152, 153, 327/158, 161, 269–271, 276–277, 284

(56) References Cited

U.S. PATENT DOCUMENTS 3,818,373 A * 6/1974 Chun et al. .................... 372/12
4,403,280 A * 9/1983 Okada ......................... 363/138
5,777,500 A * 7/1998 Eitrheim ...................... 327/161
5,815,017 A * 9/1998 McFarland .................... 327/158
6,055,287 A * 4/2000 McEwan ....................... 327/156
6,130,563 A * 10/2000 Pilling et al. ................. 327/111
6,147,531 A * 11/2000 McCall et al. ................ 327/147

* cited by examiner

Primary Examiner—Kenneth B. Wells
Assistant Examiner—Cassandra Cox
(74) Attorney, Agent, or Firm—Mills & Onello, LLP

(57) ABSTRACT

A delay locked loop circuit having a duty cycle correction function and a delay locking method are provided. The delay locked loop circuit includes a delaying portion for generating a first output signal by uniformly delaying an input first clock signal and generating a second output signal by variably delaying the first clock signal and an output signal generator for generating a second clock signal, the voltage level of which increases when the first output signal is transitioned from a first logic state to a second logic state and whose voltage level is reduced when the second output signal is transitioned from the second logic state to the first logic state. Accordingly, jitter that exists in the signal output from the delay locked loop circuit is reduced.

18 Claims, 5 Drawing Sheets

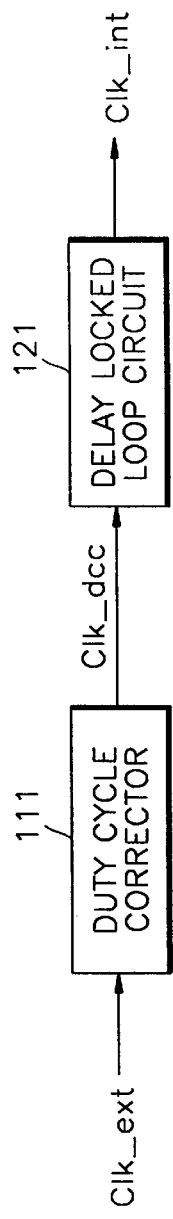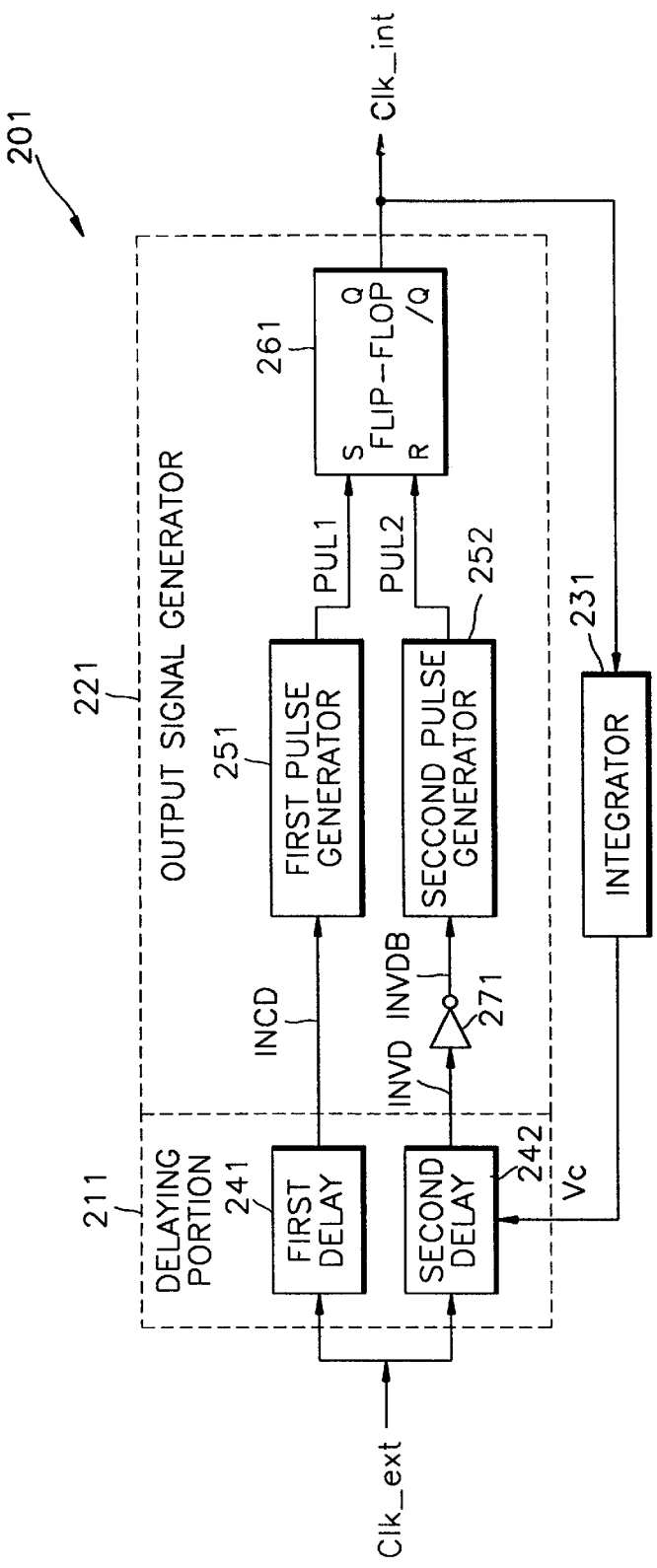

DELAY LOCKED LOOP CIRCUIT HAVING DUTY CYCLE CORRECTION FUNCTION AND DELAY LOCKING METHOD

BACKGROUND OF THE INVENTION

1. Field of the Invention

The present invention relates to a delay locked loop circuit, and more particularly, to a delay locked loop circuit having a duty cycle correction function and a delay locked method.

2. Description of the Related Art

A delay locked loop circuit, widely deployed in semiconductor devices, receives an external clock signal and generates an internal clock signal for synchronizing signals within the semiconductor device. The internal clock signal is generated to precede the external clock signal by a predetermined time period.

FIG. 1 is a block diagram of a conventional delay locked loop circuit and a conventional duty cycle corrector. Referring to FIG. 1, the duty cycle corrector 111 and delay locked loop circuit 121 are serially connected to each other. The duty cycle corrector 111 corrects the duty cycle of the external clock signal (Clk_ext). The delay locked loop circuit 121 receives a clock signal (Clk_dcc), in which the duty cycle is corrected, and generates the internal clock signal (Clk_int), whose phase leads the phase of the external clock signal (Clk_ext). Jitter, or phase noise, always exists in the clock signal (Clk_dcc) output from the duty cycle corrector 111. The delay locked loop circuit 121 likewise generates jitter. Jitter obtained by adding the jitter generated by the duty cycle corrector 111 to the jitter generated by the delay locked loop circuit 121 exists in the internal clock signal (Clk_int) output from the delay locked loop circuit 121.

The delay locked loop circuit 121 requires a first locking time for making the phase of the received clock signal (Clk_dcc) the same as the phase of the output internal clock signal (Clk_int). The duty cycle corrector 111 also requires a second locking time for making the phase of the received external clock signal (Clk_ext) the same as the phase of the output clock signal (Clk_dcc). Therefore, the overall system locking time is the sum of the first and second locking times in the case where the duty cycle corrector 111 and the delay locked loop 121 are serially connected.

SUMMARY OF THE INVENTION

To address the above limitations, it is an object of the present invention to provide a delay locked loop circuit, in which jitter and locking time are reduced.

It is another object of the present invention to provide a delay locked method, which is capable of reducing the jitter and locking time.

To achieve the first object, according to an aspect of the present invention, there is provided a delay locked loop circuit, comprising a delaying portion for generating a first output signal by uniformly delaying an input first clock signal and generating a second output signal by variably delaying the first clock signal and an output signal generator for generating a second clock signal, the voltage level of which increases when the first output signal is transitioned from a first logic state to a second logic state and the voltage level of which is reduced when the second output signal is transitioned from the second logic state to the first logic state.

It is preferable that the delay locked loop circuit further comprises an integrator for integrating the second clock signal and that the delaying portion generates the second output signal by variably delaying the first clock signal in response to the output signal of the integrator.

The delaying portion preferably comprises a first delay for delaying the first clock signal and generating the first output signal and a second delay for generating the second output signal by variably delaying the first clock signal.

The output signal generator preferably comprises a first pulse signal generator for generating a first pulse signal when the first output signal is transitioned from the first logic state to the second logic state, a second pulse signal generator for generating a second pulse signal when the second output signal is transitioned from the second logic state to the first logic state, and a flip-flop for generating the second clock signal, whose voltage level is increased when the first pulse signal is generated and whose voltage level is reduced when the second pulse signal is generated.

According to another aspect of the present invention, there is provided a delay locked loop circuit, comprising a delaying portion for generating first and second output signals by delaying an input first clock signal by a predetermined time and selectively varying the output time of the first and second output signals and an output signal generator for generating a second clock signal, the voltage level of which is increased when the first output signal is transitioned from a first logic state to a second logic state and the voltage level of which is reduced when the second output signal is transitioned from the second logic state to the first logic state.

It is preferable that the delay locked loop circuit further comprises an integrator for integrating the second clock signal and that the delaying portion variably delays the first clock signal in response to the output signal of the integrator.

The delaying portion preferably comprises a first multiplexer for receiving a reference voltage and a control signal and outputting either the reference voltage or the control signal in response to a selection signal, a first delay for generating a first output signal by controlling the delay time of an input first clock signal in response to the output of the first multiplexer, a second multiplexer for receiving the reference voltage and the control signal and outputting either the reference voltage or the control signal, and a second delay for generating a second output signal by controlling the delay time of the first clock signal in response to the output of the second multiplexer.

It is preferable that the first delay uniformly delays the first clock signal when the first multiplexer outputs the reference voltage and variably delays the first clock signal when the second multiplexer outputs the control signal.

To achieve the second object, according to an aspect of the present invention, there is provided a delay locking method, comprising the steps of receiving a first clock signal, generating a first output signal by uniformly delaying the first clock signal, transitioning a second clock signal from a logic "low" level to a logic "high" level when the first output signal is transitioned from a first logic state to a second logic state, and transitioning the second clock signal from the logic "high" level to the logic "low" level when the second output signal is transitioned from the second logic state to the first logic state.

It is preferable that the step of generating the second output signal further comprises the step of integrating the second clock signal and that the output time of the second output signal varies in response to a signal generated by integrating the second clock signal.

According to another aspect of the present invention, there is provided a delay locking method, comprising the steps of receiving a first clock signal, generating a first output signal by delaying the first clock signal for a first predetermined time, generating a second output signal by delaying the first clock signal for a second predetermined time, transitioning a second clock signal from a logic "low" level to a logic "high" level when the first output signal is transitioned from a first logic state to a second logic state, and transitioning the second clock signal from the logic "high" level to the logic "low" level when a second output signal is transitioned from the second logic state to the first logic state, wherein the output time of the second output signal is variable when the output time of the first output signal is uniform and the output time of the second output signal is uniform when the output time of the first output signal is variable.

It is preferable that each of the steps of generating the first and second output signals further comprises the step of integrating the second clock signal and that the output times of the first and second output signals selectively vary in response to the signal generated by integrating the second clock signal.

According to the present invention, jitter that exists in a signal output from a delay locked loop circuit is reduced.

BRIEF DESCRIPTION OF THE DRAWING(S)

The above objects and advantages of the present invention will become more apparent by describing in detail a preferred embodiment thereof with reference to the attached drawings in which:

FIG. 1 is a block diagram illustrating a conventional duty cycle corrector and a conventional delay locked loop circuit;

FIG. 2 is a block diagram of a delay locked loop circuit according to a first embodiment of the present invention;

Figure 4:
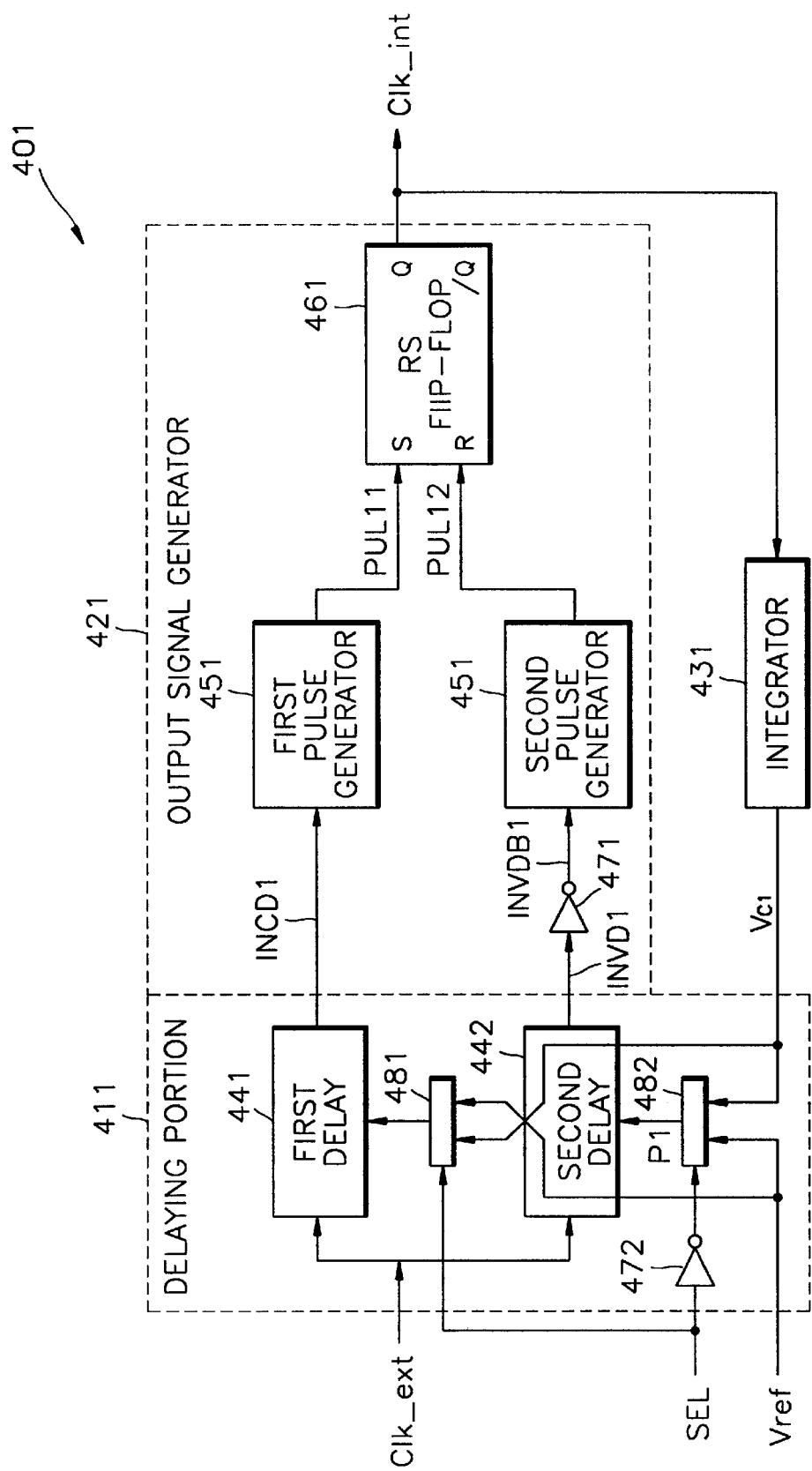
Figure 5:
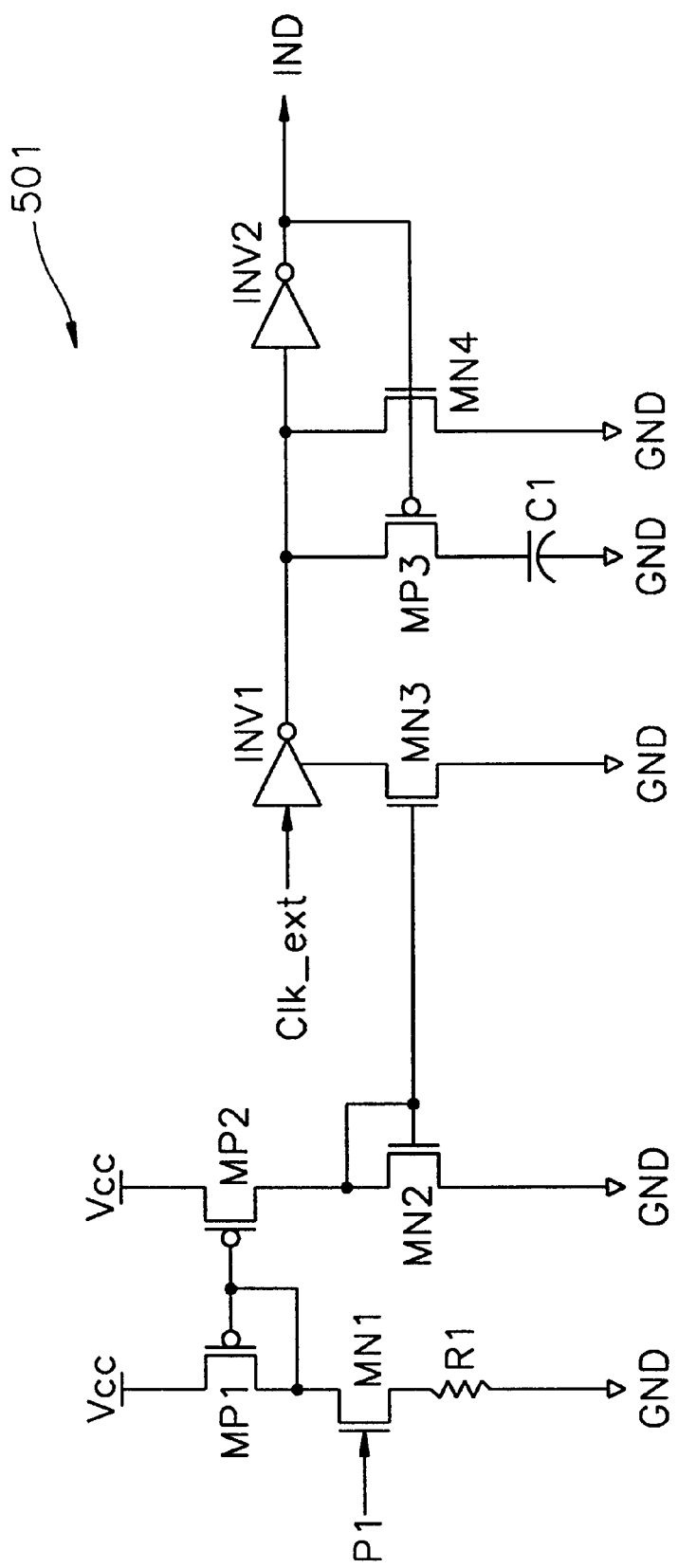

FIG. 4 is a block diagram of a delay locked loop according to a second embodiment of the present invention; and FIG. 5 is a circuit diagram for showing one of the second delay units 242 shown in FIG. 2 and the first and second delay units 441 and 442 shown in FIG. 4.

DETAILED DESCRIPTION OF PREFERRED EMBODIMENTS

The present invention now will be described more fully with reference to the accompanying drawings, in which preferred embodiments of the invention are shown. The same reference numerals in different drawings represent the same elements.

FIG. 2 is a block diagram of a delay locked loop circuit 201 according to a first embodiment of the present invention. Referring to FIG. 2, the delay locked loop circuit 201 includes a delaying portion 211, an output signal generator 221, and an integrator 231.

The delaying portion 211 generates a first clock signal (INCD) by regularly delaying a first clock signal (Clk_ext) and generates a second clock signal (INVD) by variably delaying the first clock signal (Clk_ext). An external clock signal received from an external source is employed as the first clock signal (Clk_ext).

The delaying portion 211 includes first and second delays 241 and 242. The first delay 241 delays the first clock signal (Clk_ext) for a predetermined time period and generates the first clock signal (INCD). Namely, after the first clock signal (Clk_ext) transitions from a logic "low" to a logic "high", the first clock signal (INCD) is transitioned from the logic "low" to the logic "high" after the lapse of a predetermined time. The predetermined time is set to be a predetermined value by a designer when the delay locked loop circuit 201 is designed.

The second delay 242 receives the first clock signal (Clk_ext) and a control signal (Vc) and generates the second clock signal (INVD). The second delay 242 variably delays the first clock signal (Clk_ext) according to the voltage level of the control signal (Vc) and outputs the variably delayed signal as the second clock signal (INVD). For example, when the voltage level of the control signal (Vc) is raised, the time taken for the second output signal (INVD) to be transitioned from the logic "low" level to the logic "high" level after the first clock signal (Clk_ext) is transitioned from the logic "low" level to the logic "high" level is reduced. When the voltage level of the control signal (Vc) is lowered, a time taken for the second output signal (INVD) to be transitioned from the logic "low" level to the logic "high" level after the first clock signal (Clk_ext) is transitioned from the logic "low" level to the logic "high" level increases. The second delay 242 operates as a variable delay for variably delaying the first clock signal (Clk_ext).

The output signal generator 221 receives the first and second output signals INCD and INVD and outputs a second clock signal (Clk_int). The level of the second clock signal (Clk_int) increases when the first output signal (INCD) is transitioned from a first logic state to a second logic state and is reduced when the second output signal (INVD) is transitioned from the second logic state to the first logic state. The second clock signal is widely used as the internal clock signal of a semiconductor device, in particular, a Rambus DRAM semiconductor device.

The output signal generator 221 includes a first pulse generator 251, a second pulse generator 252, an inverter 271, and a flip-flop 261.

The first pulse generator 251 generates a first pulse signal (PUL1) in response to the first output signal (INCD). Namely, when the first output signal (INCD) is transitioned from the first logic state to the second logic state, for example, from the logic "low" level to the logic "high" level, the first pulse generator 251 generates the first pulse signal (PUL1). The second output signal (INVD) is inverted by the inverter 271 and is input to the second pulse generator 252. The second pulse generator 252 includes a pulse generator that performs the same operation as the operation of the first pulse generator 251. Therefore, the second pulse generator 252 generates a second pulse signal (PUL2) when the second output signal (INVD) is transitioned from the second logic state to the first logic state, for example, from the logic "high" level to the logic "low" level.

The flip-flop 261 receives the first and second pulse signals (PUL1 and PUL2) and outputs the second clock signal (Clk_int). Namely, the flip-flop 261 transitions the second clock signal (Clk_int) from the logic "low" level to the logic "high" level in response to the first pulse signal (PUL1) and transitions the second clock signal (Clk_int) from the logic "high" level to the logic "low" level in response to the second pulse signal (PUL2). Various flip-flops can be employed as the flip-flop 261. Here, an RS flip-flop is used as the flip-flop 261. Therefore, the first pulse generator 251 is connected to the set terminal (S) of the RS flip-flop 261 and the second pulse generator 252 is connected to the reset terminal (R) of the RS flip-flop 261.

The integrator 231 receives the second clock signal (Clk_int) and generates the control signal (Vc). The voltage level of the control signal (Vc) is lowered when the duty cycle of the second clock signal (Clk_int) is relatively short and is raised when the duty cycle of the second clock signal (Clk_int) is relatively long.

Figure 3A:
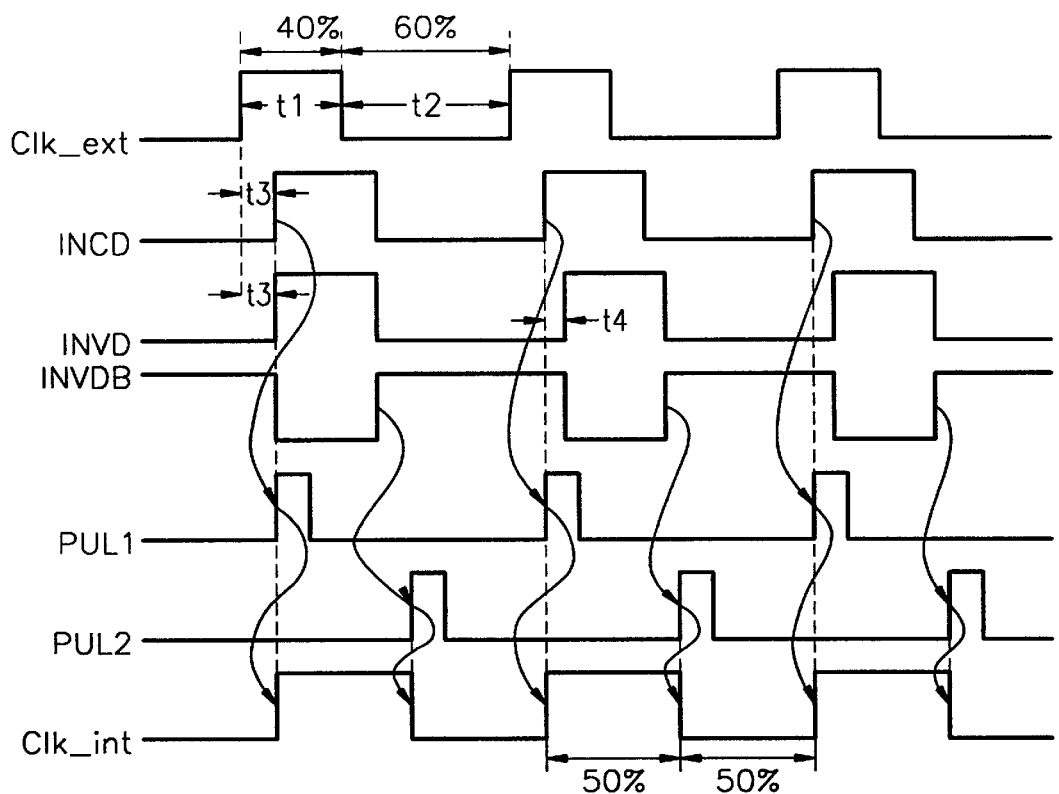
FIG. 3A is a timing diagram of signals that show a manner in which the duty cycle of a first clock signal is corrected to be 50% when the duty cycle of the first clock signal is shorter than 50% and the first clock signal is delay locked.

FIG. 3A is a timing diagram of signals that show a manner in which the duty cycle of the first clock signal is corrected to be 50% when the duty cycle of the first clock signal is shorter than 50% and the first clock signal is delay locked. Referring to FIG. 3A, the logic "high" period (t1) of the first clock signal (Clk_ext) is shorter than the logic "low" period (t2) of the first clock signal Clk_ext. Namely, the duty cycle of the first clock signal (Clk_ext) is less than 50%. Referring to FIG. 3A, the operation of the delay locked loop circuit shown in FIG. 2 will now be described.

When the first clock signal (Clk_ext), the duty cycle of which is shorter than 50%, is input to the delaying portion 211, the first and second output signals (INCD and INVD) are generated by the first and second delays 241 and 242 after the lapse of a first predetermined time (t3) period. The first pulse generator 251 generates the first pulse signal (PUL1) in synchronization with the rising edge of the first output signal (INCD). The second pulse generator 252 generates the second pulse signal (PUL2) in synchronization with the rising edge of the inversion signal (INVDB) of the second output signal (INVD). When the first pulse signal (PUL1) is generated, the flip-flop 261 transitions the second clock signal (Clk_int) from the logic "low" level to the logic "high" level. When the second pulse signal (PUL2) is generated, the flip-flop 261 transitions the second clock signal (Clk_int) from the logic "high" level to the logic "low" level. At this time, the duty cycle of the generated second clock signal (Clk_int) is shorter than 50%, as is the duty cycle of the first clock signal (Clk_ext).

The integrator 231 receives the second clock signal (Clk_int), generates the control signal (Vc), and provides the control signal (Vc) to the second delay 242. At this time, since the duty cycle of the second clock signal (Clk_int) is shorter than 50%, the voltage level of the control signal (Vc) is reduced. When the first clock signal (Clk_ext) is transitioned from the logic "low" level to the logic "high" level, the second delay 242 delays the time taken for the second output signal (INVD) to be transitioned from the logic "low" level to the logic "high" level by a second predetermined time (t4) than in an initial state and outputs the second output signal (INVD) since the voltage level of the control signal (Vc) is low. The second pulse signal output from the second pulse generator 252 is output in a state of being delayed by the second predetermined time (t4) than in the initial state. Namely, the period of the first pulse signal (PUL1) is equal to the period of the second pulse signal (PUL2). Since the flip-flop 261 outputs the second clock signal (Clk_int) in synchronization with the rising edge of the first pulse signal (PUL1) and the falling edge of the second pulse signal (PUL2), the duty cycle of the second clock signal (Clk_int) is corrected to be 50% and then, the second clock signal (Clk_idnt) is output.

Since the voltage level of the control signal (Vc) output from the integrator 231 becomes lower as the duty cycle of the first clock signal (Clk_ext) is shorter and thus, the time, at which the rising edge of the second output signal (INVD) is generated, is delayed, the duty cycle of the second clock signal (Clk_int) is corrected to be 50%. Also, the second clock signal (Clk_int) is generated prior to the first clock signal (Clk_ext) by a predetermined time.

Figure 3B:
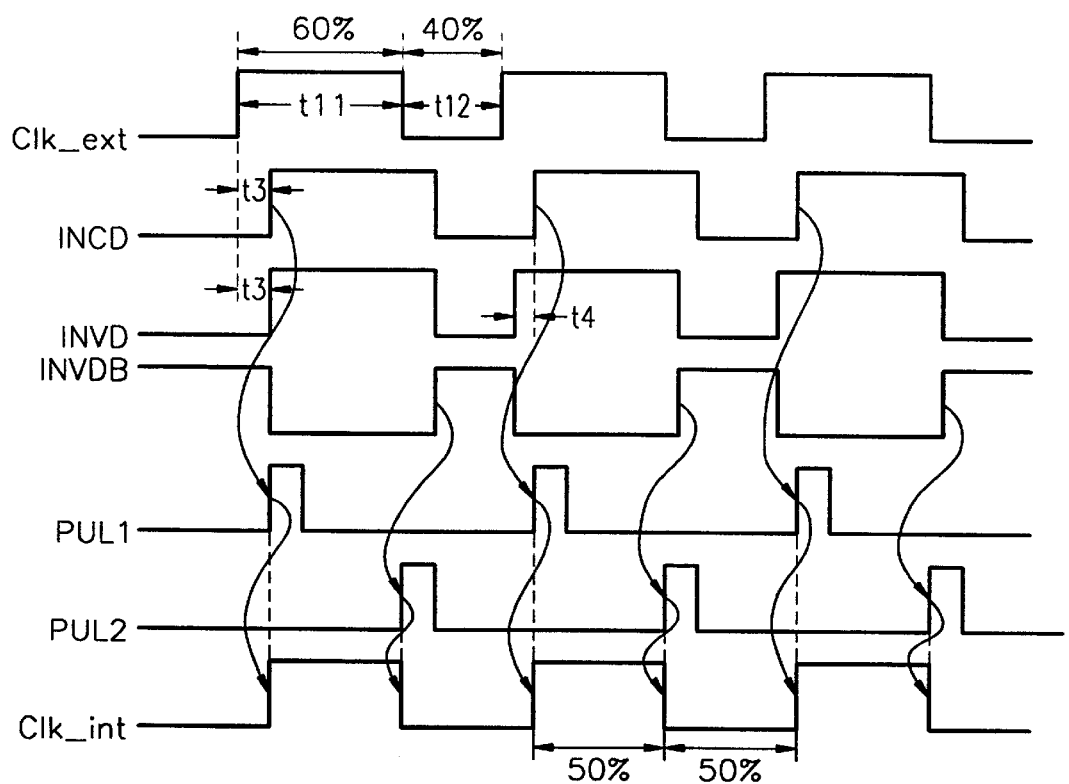
FIG. 3B is a timing diagram of signals that show a manner in which the duty cycle of the first clock signal is corrected to be 50% when the duty cycle of the first clock signal is longer than 50% and the first clock signal is delay locked.

FIG. 3B is a timing diagram of signals that show the manner in which the duty cycle of the first clock signal is corrected to be 50% when the duty cycle of the first clock signal is longer than 50% and the first clock signal is delay locked. Referring to FIG. 3B, the logic "high" period (t11) of the first clock signal (Clk_ext) is longer than the logic "low" period (t12) of the first clock signal (Clk_ext). Namely, the duty cycle of the first clock signal (Clk_ext) is longer than 50%. The operation of the delay locked loop circuit 201 shown in FIG. 2 will now be described with reference to FIG. 3B.

When the first clock signal (Clk_ext), the duty cycle of which is longer than 50%, is initially input to the delaying portion 211, the first and second output signals (INCD and INVD) are generated by the first and second delays 241 and 242 after the lapse of the first predetermined time (t3). The first pulse generator 251 generates the first pulse signal (PUL1) in synchronization with the rising edge of the first output signal (INCD). The second pulse generator 252 generates the second pulse signal (PUL2) in synchronization with the rising edge of the inversion signal (INVDB) of the second output signal (INVD). When the first pulse signal (PUL1) is generated, the flip-flop 261 transitions the second clock signal (Clk_int) from the logic "low" level to the logic "high" level. When the second pulse signal (PUL2) is generated, the flip-flop 261 transitions the second clock signal (Clk_int) from the logic "high" level to the logic "low" level. At this time, the duty cycle of the generated second clock signal (Clk_int) is longer than 50%, as is the duty cycle of the first clock signal (Clk_ext).

Since the duty cycle of the second clock signal (Clk_int) is longer than 50%, the integrator 231 increases the voltage level of the control signal (Vc) and provides the control signal to the second delay 242. When the first clock signal (Clk_ext) is transitioned from the logic "low" level to the logic "high" level in this state, the second delay 242 advances the time, at which the second output signal (INVD) is transitioned from the logic "low" level to the logic "high" level, by a third predetermined time (t5) than in an initial state and outputs the second output signal (INVD). Then, the second pulse signal (PUL2) output from the second pulse generator 252 is output faster than in the initial time period. Namely, the period of the first pulse signal (PUL1) is equal to the period of the second pulse signal (PUL2). Therefore, the duty cycle of the second clock signal (Clk_int) generated from the flip-flop 261 is output in a state of being corrected to be 50%.

The voltage level of the control signal (Vc) output from the integrator 231 becomes higher as the duty cycle of the first clock signal (Clk_ext) is longer. Accordingly, the time, at which the rising edge of the second output signal (INVD) is generated, is advanced. Therefore, the duty cycle of the second clock signal (Clk_int) is corrected to be 50%. The second clock signal (Clk_int) is generated prior to the first clock signal (Clk_ext) by a predetermined time.

FIG. 4 is a block diagram of a delay locked loop circuit 401 according to a second embodiment of the present invention. Referring to FIG. 4, the delay locked loop circuit 401 includes a delaying portion 411, an output signal generator 421, and an integrator 431.

The delaying portion 411 delays the input first clock signal (Clk_ext) for a predetermined time period and generates first and second output signals (INCD1 and INVD1).

Namely, the delaying portion 411 selectively varies the time, at which the first and second output signals (INCD1 and INVD1) are generated, after the first clock signal (Clk_ext) is input. The delaying portion 411 includes first and second delays 441 and 442, first and second multiplexers 481 and 482, and an inverter 472.

First and second multiplexers 481 and 482 receive a reference signal (Vref) and a control signal (Vc1) output from the integrator 431, respectively, and output either the reference signal (Vref) or the control signal (Vc1) as a signal (P1) in response to a selection signal (sel). Since an inverter 472 is connected to the input port of the second multiplexer 482, the voltage level of the selection signal (sel) input to the first multiplexer 481 is opposite to the voltage level of the selection signal (sel) input to the second multiplexer 482. For example, when the voltage level of the selection signal (sel) input to the first multiplexer 481 is the logic "low" level, the voltage level of the selection signal (sel) input to the second multiplexer 482 is logic "high". Therefore, when the reference signal (Vref) is output from the first multiplexer 481, the control signal (Vc1) is output from the second multiplexer 482. When the control signal (Vc1) is output from the first multiplexer 481, the reference signal (Vref) is output from the second multiplexer 482. It is preferable that the voltage level of the reference signal (Vref) is set to be half of the source voltage (Vcc) supplied to the delay locked loop circuit.

Either the first delay 441 or the second delay 442, to which the reference signal (Vref) is input, uniformly delays the first clock signal (Clk_ext). Either the first delay 441 or the second delay 442, to which the control signal (Vc1) is input, variably delays the first clock signal (Clk_ext). Namely, when the first delay 441 uniformly delays the first clock signal (Clk_ext), the second delay 442 variably delays the first clock signal (Clk_ext). When the first delay 441 variably delays the first clock signal (Clk_ext), the second delay 441 uniformly delays the first clock signal (Clk_ext). The first output signal (INCD1) output from the first delay 441 is input to the first pulse generator 451 and the second output signal (INVD1) output from the second delay 442 is input to the second pulse generator 452.

The second clock signal (Clk_int) is generated from the output signal generator 421. The output signal generator 421 includes a first pulse generator 451, a second pulse generator 452, and a flip-flop 461. Since the structures and operations of the output signal generator 421 and the integrator 431 are similar to the structures and operations of the output signal generator 221 and the integrator 231, which are shown in FIG. 2, description thereof will be omitted.

Timing diagrams of signals when the control signal (Vc1) is input to the second delay 442 and the reference signal (Vref) is input to the first delay 441 are the same as FIGS. 3A and 3B. When the control signal (Vc1) is input to the first delay 441 and the reference signal (Vref) is input to the second delay 442, the second delay 442 uniformly delays the first clock signal (Clk_ext) and the first delay 441 variably delays the first clock signal (Clk_ext) in response to the control signal (Vc1) output from the integrator 431. Since the point of time, at which a first pulse signal (PUL11) is generated, is controlled, meanwhile, the point of time, at which a second pulse signal (PUL12) is generated, is uniform, the duty cycle of the second clock signal (Clk_int) output from the flip-flop 461 is corrected to be 50% when the duty cycle of the first clock signal (Clk_ext) is longer or shorter than 50%.

As mentioned above, since the first and second delays 441 and 442 can variably delay the first clock signal (Clk_ext), if necessary, when the duty cycle of the first clock signal (Clk_ext) is longer or shorter than 50%, the delay locked loop circuit 401 can correct the duty cycle of the first clock signal (Clk_ext) to be 50% and output the duty cycle.

FIG. 5 is a circuit diagram for showing one of the second delay unit 242 shown in FIG. 2 and the first and second delay units 441 and 442 shown in FIG. 4. Referring to FIG. 5, a delay unit 501 receives the first clock signal (Clk_ext) and the signal (P1) and generates the output signal (IND). The output signal (IND) is the second clock signal (INVD) shown in FIG. 2 or either the first clock signal (INCD1) or the second clock signal (INVD1), which is shown in FIG. 4. When either the first delay 441 or the second delay 442, which is shown in FIG. 4 is used as the delay 501, the first delay 441 or the second delay 442 operates as a variable delay.

The delay 501 includes NMOS transistors (MN1 through MN4), PMOS transistors (MP1 through MP3), invertors (INV1 and INV2), and a resistor (R1). The PMOS transistors (MP1 and MP2) and the NMOS transistors (MN2 and MN3) form current mirrors, respectively. When the voltage level of the signal (P1) gradually increases in a state that the voltage level of the signal (P1) is higher than the threshold voltage of the NMOS transistor (MN1), current that flows through the resistor (R1) increases. Then, current that flows in the NMOS transistor (MN2) increases due to the current mirror consisting of the PMOS transistors (MP1 and MP2). Then, current that flows through the NMOS transistor (MN3) increases due to the current mirror consisting of the PMOS transistors (MN2 and MN3). When the first clock signal (Clk_ext) is transitioned from the logic "low" level to the logic "high" level in this state, the pull-down current of the inverter (INV1) that flows to a ground (GND) through the NMOS transistor (MN3) rapidly increases. Accordingly, the voltage level of a node (N1) is rapidly reduced to a ground voltage level. When the voltage level of the node (N1) is reduced, the output signal (IND) is transitioned to the logic "high" level by an inverter (INV2).

When the voltage level of the signal (P1) increases, the time, at which the node (N1) is charged, is advanced. Accordingly, the time, at which the output signal (IND) is output, is advanced. When the voltage level of the signal (P1) is reduced, the time, at which the node (N1) is discharged, is delayed. Accordingly, the time, at which the output signal (IND) is output, is delayed. Accordingly, the output time of the output signal (IND) is controlled according to the voltage level of the signal (P1).

Since the inverter (INV2) and the NMOS transistor (MN4) form a latch, the voltage level of the output signal (IND) is maintained to at either the logic "high" level or the logic "low" level. Also, in order to prevent a case, where the output signal of the inverter (INV1) does not perform full swing at a high clock frequency since a slope, with which the voltage of the node (N1) is transitioned from the logic "high" to the logic "low", is slow, from occurring, when the voltage level of the node (N1) is lower than the threshold voltage of the inverter (INV2), the NMOS transistor (MN4) discharges the node (N1). The PMOS transistor (PM3) and the capacitor (C1) increase the discharge speed when the voltage of the node (N1) is discharged. Accordingly, the switching time of the output signal (IND) is advanced.

The delay locked loop circuits 201 and 401 are widely used for the semiconductor device, in particular, the Rambus DRAM semiconductor device.

As mentioned above, according to the present invention, the delay locked loop circuits 201 and 401 have a duty cycle correction function. Therefore, the locking time is greatly reduced than when a duty cycle corrector is additionally included. Also, the jitter included in the second clock signal (Clk_int) is greatly reduced.

In the drawings and specification, there have been disclosed typical preferred embodiments of the invention and, although specific terms are employed, they are used in a generic and descriptive sense only and not for purpose of limitation. Therefore, it will be understood by those skilled in the art that various changes in form and details may be made therein without departing from the spirit and scope of the invention as defined by the appended claims.

What is claimed is:

1. A delay locked loop circuit, comprising:
    a delaying portion for generating a first output signal by uniformly delaying an input first clock signal and generating a second output signal by variably delaying the first clock signal;
    an output signal generator for generating a second clock signal, a voltage level of which increases when the first output signal is transitioned from a first logic state to a second logic state and the voltage level of which is reduced when the second output signal is transitioned from the second logic state to the first logic state; and
    an integrator for integrating the second clock signal and wherein the delaying portion generates the second output signal by variably delaying the first clock signal in response to an output signal of the integrator.

2. The delay locked loop circuit of claim 1, wherein the first logic state of the first output signal is a logic "low" level and the second logic state of the first output signal is a logic "high" level.

3. The delay locked loop circuit of claim 1, wherein the first logic state of the second output signal is the logic "low" level and the second logic state of the first output signal is the logic "high" level.

4. The delay locked loop circuit of claim 1, wherein the delaying portion comprises:
    a first delay for delaying the first clock signal and generating the first output signal; and
    a second delay for generating the second output signal by variably delaying the first clock signal.

5. The delay locked loop circuit of claim 1, wherein the output signal generator comprises:
    a first pulse signal generator for generating a first pulse signal when the first output signal transitions from the first logic state to the second logic state;
    a second pulse signal generator for generating a second pulse signal when the second output signal transitions from the second logic state to the first logic state; and
    a flip-flop for generating the second clock signal, the voltage level of which is increased when the first pulse signal is generated and the voltage level of which is reduced when the second pulse signal is generated.

6. A delay locked loop circuit, comprising:
    a delaying portion for generating first and second output signals by delaying an input first clock signal by a predetermined time period and by selectively varying the output time of the first and second output signals;
    an output signal generator for generating a second clock signal, a voltage level of which is increased when the first output signal is transitioned from a first logic state to a second logic state and the voltage level of which is reduced when the second output signal is transitioned from the second logic state to the first logic state; and
    an integrator for integrating the second clock signal and wherein the delaying portion variably delays the output time in response to an output signal of the integrator.

7. The delay locked loop circuit of claim 6, wherein the first logic state of the second output signal is a logic "low" level and the second logic state of the first output signal is a logic "high" level.

8. The delay locked loop circuit of claim 6, wherein the first logic state of the second output signal is the logic "high" level and the second logic state of the first output signal is the logic "low" level.

9. The delay locked loop circuit of claim 6, wherein the delaying portion comprises:
    a first multiplexer for receiving a reference voltage and a control signal and outputting either the reference voltage or the control signal in response to a selection signal;
    a first delay for generating a first output signal by controlling the delay time of an input first clock signal in response to the output of the first multiplexer;
    a second multiplexer for receiving the reference voltage and the control signal and outputting either the reference voltage or the control signal; and
    a second delay for generating a second output signal by controlling the delay time of the first clock signal in response to the output of the second multiplexer.

10. The delay locked loop circuit of claim 6, wherein the output signal generator comprises:
    a first pulse signal generator for generating a first pulse signal when the first output signal is transitioned from a first logic state to a second logic state;
    a second pulse signal generator for generating a second pulse signal when the second output signal is transitioned from the second logic state to the first logic state; and
    a flip-flop for generating the second clock signal, the voltage level of which is increased when the first pulse signal is generated and the voltage level of which is reduced when the second pulse signal is generated.

11. The delay locked loop circuit of claim 9, wherein the first delay uniformly delays the first clock signal when the first multiplexer outputs the reference voltage and variably delays the first clock signal when the second multiplexer outputs the control signal.

12. The delay locked loop circuit of claim 9, wherein the reference voltage is half of a source voltage of the delay locked loop circuit.

13. A delay locking method, comprising the steps of:
    receiving a first clock signal;
    generating a first output signal by uniformly delaying the first clock signal;
    generating a second output signal by delaying the first clock signal for a first predetermined time;
    generating a second clock signal based on transitions of the first and second output signals, wherein:
        the second clock signal transitions from a logic "low" level to a logic "high" level when the first output signal is transitioned from a first logic state to a second logic state; and
        the second clock signal transitions from the logic "high" level to the logic "low" level when the second output signal is transitioned from the second logic state to the first logic state; and wherein
    generating the second output signal further comprises the step of integrating the second clock signal and wherein the first predetermined time delay of the generation of the second output signal varies in response to a signal generated by integrating the second clock signal.

14. A delay locking method, comprising the steps of:

receiving a first clock signal;

generating a first output signal by delaying the first clock signal for a first predetermined time;

generating a second output signal by delaying the first clock signal for a second predetermined time;

generating a second clock signal based on transitions of the first and second output signals, wherein:

the second clock signal transitions from a logic "low" level to a logic "high" level when the first output signal is transitioned from a first logic state to a second logic state; and the second clock signal transitions from the logic "high" level to the logic "low" level when the second output signal is transitioned from the second logic state to the first logic state, wherein the output time of the second output signal is variable, when the output time of the first output signal is uniform and the output time of the second output signal is uniform when the output time of the first output signal is variable.

15. The method of claim 14, wherein each of the steps of generating the first and second output signals further comprises the step of integrating the second clock signal and the output times of the first and second output signals selectively vary in response to the signal generated by integrating the second clock signal.

16. A delay locked loop circuit, comprising:

a delaying portion for generating first and second output signals by delaying an input first clock signal by a predetermined time period and by selectively varying the output time of the first and second output signals;

an output signal generator for generating a second clock signal, a voltage level of which is increased when the first output signal is transitioned from a first logic state to a second logic state and the voltage level of which is reduced when the second output signal is transitioned from the second logic state to the first logic state;

wherein the delaying portion comprises:

a first multiplexer for receiving a reference voltage and a control signal and outputting either the reference voltage or the control signal in response to a selection signal;

a first delay for generating a first output signal by controlling the delay time of an input first clock signal in response to the output of the first multiplexer;

a second multiplexer for receiving the reference voltage and the control signal and outputting either the reference voltage or the control signal; and a second delay for generating a second output signal by controlling the delay time of the first clock signal in response to the output of the second multiplexer.

17. The delay locked loop circuit of claim 16, wherein the first delay uniformly delays the first clock signal when the first multiplexer outputs the reference voltage and variably delays the first clock signal when the second multiplexer outputs the control signal.

18. The delay locked loop circuit of claim 16, wherein the reference voltage is half of a source voltage of the delay locked loop circuit.

* * * * *